(12) United States Patent
Linewih et al.

(10) Patent No.: US 11,942,415 B2
(45) Date of Patent: Mar. 26, 2024

(54) THIN FILM BASED PASSIVE DEVICES AND METHODS OF FORMING THE SAME

(71) Applicant: GLOBALFOUNDRIES Singapore Pte. Ltd., Singapore (SG)

(72) Inventors: Handoko Linewih, Singapore (SG); Chor Shu Cheng, Singapore (SG); Tze Ho Simon Chan, Singapore (SG); Yudi Setiawan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/888,532

(22) Filed: Aug. 16, 2022

(65) Prior Publication Data
US 2022/0392837 A1 Dec. 8, 2022

Related U.S. Application Data

(62) Division of application No. 16/587,122, filed on Sep. 30, 2019, now abandoned.

(51) Int. Cl.
*H01L 23/522* (2006.01)
*H01L 21/70* (2006.01)
*H01L 49/02* (2006.01)

(52) U.S. Cl.
CPC ........ *H01L 23/5223* (2013.01); *H01L 21/707* (2013.01); *H01L 23/5226* (2013.01); *H01L 23/5228* (2013.01); *H01L 28/24* (2013.01); *H01L 28/40* (2013.01)

(58) Field of Classification Search
CPC ..... H01L 21/4846–4867; H01L 21/481; H01L 21/485; H01L 21/74–746; H01L 21/768–76898; H01L 21/76838–76895; H01L 23/373–3738; H01L 2221/10–1094; H01L 23/5223; H01L 23/5226; H01L 23/5228; H01L 21/707;
(Continued)

(56) References Cited

U.S. PATENT DOCUMENTS

| 7,148,089 B2 * | 12/2006 | Hung | H01L 23/5258 257/E23.149 |
| 2008/0173981 A1 * | 7/2008 | Chinthakindi | H01L 28/91 257/E21.011 |

(Continued)

*Primary Examiner* — Natalia A Gondarenko
(74) *Attorney, Agent, or Firm* — VIERING JENTSCHURA & PARTNER MBB

(57) ABSTRACT

A device may include a substrate, and an interlevel dielectric arranged over the substrate. The interlevel dielectric may include a first interlevel dielectric layer in an interconnect level i, the first interlevel dielectric layer having a first interconnect and a second interconnect therein. A nitride block insulator may be arranged over the first interlevel dielectric layer and over the first interconnect and the second interconnect. An opening may be arranged in the nitride block insulator, the opening extending through the nitride block insulator to expose a surface of the first interconnect in the first interlevel dielectric layer. A contact plug may be arranged in the opening of the nitride block insulator. The contact plug at least lines the opening and prevents outdiffusion of conductive material from the first interconnect. A thin film of a passive component may be arranged over the nitride block insulator and over the contact plug.

19 Claims, 11 Drawing Sheets

(58) Field of Classification Search
CPC ......... H01L 28/24; H01L 28/40; H01L 28/60; H01L 28/86
USPC .............. 257/100, 532, 536, 29.342, 27.025; 438/384, 381
See application file for complete search history.

(56) References Cited

U.S. PATENT DOCUMENTS

| | | | |
|---|---|---|---|
| 2013/0141834 A1* | 6/2013 | Le Neel | H01L 28/55 361/301.1 |
| 2014/0184381 A1* | 7/2014 | Hao | H01L 28/24 29/25.42 |
| 2016/0218062 A1* | 7/2016 | Aggarwal | H01L 23/5228 |
| 2017/0317143 A1* | 11/2017 | Chen | H10B 63/80 |

* cited by examiner

THIN FILM BASED PASSIVE DEVICES AND METHODS OF FORMING THE SAME

CROSS-REFERENCE TO RELATED APPLICATION

This application is a Divisional application and claims priority to U.S. application Ser. No. 16/587,122 filed on Sep. 30, 2019; which is incorporated by reference herein in its entirety.

TECHNICAL FIELD

The present disclosure relates generally to semiconductor devices, and more particularly to thin film based passive components embedded in devices and methods for forming the same.

BACKGROUND

Thin film (TF) based passive components such as thin film resistors (TFRs) and thin film capacitors (TFCs) are employed in high precision analog and mixed signal or radio frequency applications, and have been utilized in many technology nodes. TFRs, for example, are mostly used as part of a complex integrated circuit to provide high precision resistance in a device having low temperature coefficient of resistance (TCR). Generally, in the fabrication of a thin film, evaporation or sputtering methods are employed followed by subsequent patterning and etching. Special care may be required to integrate thin films into existing process flows of an integrated circuit. For example, the process to contact the overlying metal interconnect layer and the TFR in a conventional top side via pick-up configuration requires the contact points of the TFR to protect the underlying TFR during the via etch which may otherwise cause punch through due to the reactive-ion etch process. In a further technique, a buffer layer is formed on top of the deposited thin film. In other fabrication processes such as in a via-less technology, a liner is deposited on top of the TFR, and selectively removed.

It is desirable to provide improved integration of thin film based passive components in devices.

SUMMARY

Embodiments generally relate to semiconductor devices and methods for forming the semiconductor devices. According to various non-limiting embodiments, a device may include a substrate, and an interlevel dielectric arranged over the substrate. The interlevel dielectric may include a first interlevel dielectric layer in an interconnect level i, the first interlevel dielectric layer having a first interconnect and a second interconnect therein. A nitride block insulator may be arranged over the first interconnect and the second interconnect. An opening may be arranged in the nitride block insulator, the opening extending through the nitride block insulator to expose a surface of the first interconnect in the first interlevel dielectric layer. A contact plug may be arranged in the opening of the nitride block insulator. The contact plug at least lines the opening and prevents out-diffusion of conductive material from the first interconnect. A thin film of a passive component may be arranged over the nitride block insulator and over the contact plug. According to various non-limiting embodiments, the passive component may be a high precision back-end capacitor. For example, the thin film, the nitride block insulator, and the first interconnect and the second interconnect may form a metal-insulating-metal (MIM) capacitor, in a non-limiting embodiment.

According to various non-limiting embodiments, the passive component may be a high precision back-end resistor. For example, a second opening may be arranged in the nitride block insulator, the second opening extending through the nitride block insulator to expose a surface of the second interconnect in the first interlevel dielectric layer, and a second contact plug may be arranged in the second opening of the nitride block insulator. The thin film further covers the second contact plug and serves as a thin film resistor, the thin film resistor electrically connects the first interconnect and the second interconnect.

According to various non-limiting embodiments, a method of forming the device is provided. The method may include providing a substrate, and arranging an interlevel dielectric over the substrate. Arranging the interlevel dielectric may include forming a nitride block insulator over a first interlevel dielectric layer in an interconnect level i of the interlevel dielectric, where the first interlevel dielectric layer comprises a first interconnect and a second interconnect therein. An opening may be formed in the nitride block insulator, the opening extending through the nitride block insulator to expose a surface of the first interconnect in the first interlevel dielectric layer. A contact plug may be formed in the opening of the nitride block insulator, where the contact plug at least lines the opening and prevents out-diffusion of conductive material from the first interconnect. A thin film of a passive component may be formed over the nitride block insulator and over the contact plug.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1A:
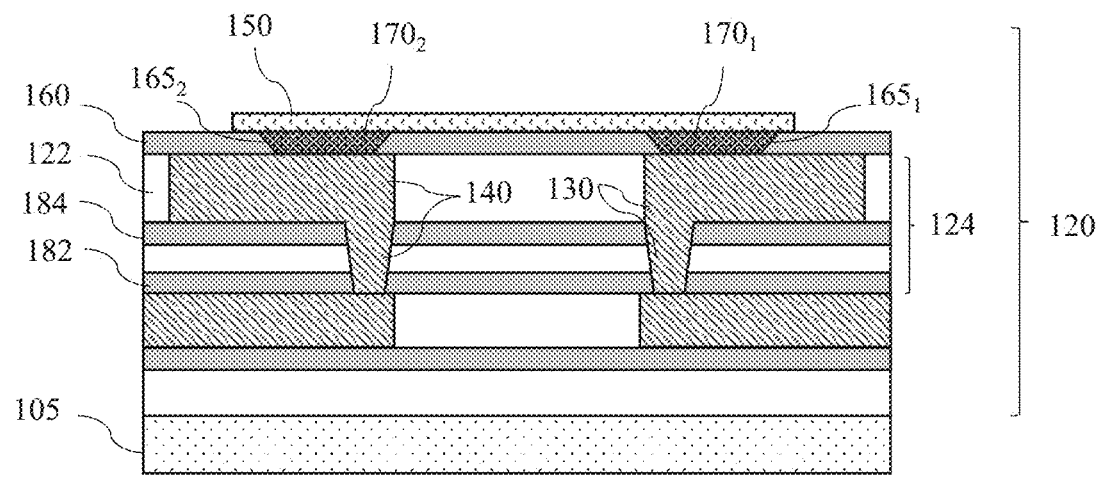
FIGS. 1A-1E show simplified cross-sectional views of embodiments of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized, and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to devices and methods for forming devices. The devices may be semiconductor devices. For example, the semiconductor devices may be integrated circuits (ICs) having embedded thin film based passive components. The thin film based passive components may be arranged in an interlevel dielectric of the device. According to various non-limiting embodiments, a thin film based passive component may be arranged between any interconnect level (between inter-metal dielectric (IMD) layers), and below a layer of the uppermost interconnect in the interlevel dielectric. According to various non-limiting embodiments, the thin film based passive components may be formed using CMOS processing. Embodiments according to the present invention as will be described advantageously enables uniform contact pick-up on thin film throughout a wafer (e.g., wafer center, wafer edge). Further, embodiments according to the present invention avoid punch-through due to reactive-ion etching compared to existing thin film passive components having conventional top side via pick-up. Furthermore, embodiments according to the present invention avoid or obviate the opening or exposure of metallic element of the thin film such as chromium (Cr) after deposition and patterning of the thin film during CMOS back-end-of-line (BEOL) process. Exposure of such material from the thin film will require a special handling during BEOL processing, i.e., separate route process due to production line contamination risks, which is undesirable. Accordingly, no contamination is introduced using a bottom pick-up connection according to various embodiments as will be described.

According to various non-limiting embodiments, the interlevel dielectric may be arranged over a substrate and may include a first interlevel dielectric layer in an interconnect level i. The first interlevel dielectric layer may include or surround a first interconnect and a second interconnect. A nitride block insulator may be arranged over the first interlevel dielectric layer and over the first interconnect and the second interconnect. One or more openings may be arranged in the nitride block insulator, the openings extending through the nitride block insulator to expose a surface of the first interconnect and/or the second interconnect in the first interlevel dielectric layer. A contact plug may be arranged in an opening of the nitride block insulator. The contact plug at least lines the opening and prevents out-diffusion of conductive material from the first interconnect. A thin film of a passive component may be arranged over the nitride block insulator and over the contact plug.

FIGS. 1A-1E show simplified cross-sectional views of embodiments of a device 100. The device 100 may be a semiconductor device (e.g., an integrated circuit (IC) chip). The device may include a substrate 105. The substrate 105 may be a semiconductor substrate, such as a silicon substrate in a non-limiting example. In some embodiments, the substrate may be a crystalline-on-insulator (COI) substrate. A COI substrate may include a surface crystalline layer separated from a bulk crystalline by an insulator layer. The insulator layer, for example, may be formed of a dielectric insulating material, such as silicon oxide, which provides a buried oxide (BOX) layer. Other types of substrates may also be useful. One or more circuit elements may be formed over and/or within the substrate (not illustrated). The circuit elements may include, for example, transistors, capacitors, or combinations thereof.

An interlevel dielectric or metallization layer 120 may be arranged over the substrate. For example, the interlevel dielectric 120 may be formed over the components on the substrate. The interlevel dielectric 120, for example, may include a plurality of interlevel dielectric (ILD) layers. The interlevel dielectric, for example, may be formed by back-end-of-line (BEOL) processing, such as in copper-based BEOL process, in a non-limiting embodiment. The ILD layers of the interlevel dielectric 120, for example, may be formed of dielectric materials, such as low-k dielectric (e.g., SiCOH), tetraethyl orthosilicate (TEOS), silicon oxide, silicon nitride and etc. The dielectric layers may be formed by chemical vapor deposition (CVD) or physical vapor deposition (PVD). Other suitable material and techniques for forming the ILD layers may also be useful.

The interlevel dielectric 120 may include interconnects disposed in the ILD layers (not fully illustrated in the interest of brevity). The interconnects connect the various components of the IC to perform the desired functions. For example, the interlevel dielectric 120 may include a plurality of interconnect levels. Each interconnect level i may include a metal level $M_i$ and a contact or via level $V_{i-1}$. The first interconnect level in the case i=1, for example, may include metal lines M1 and via contacts CA. The subsequent interconnect level, for example in the case i=2, may include metal lines M2 and via contacts V1. For example, a metal level may include metal or conductive lines, while a contact level may include via contacts. It is understood that there may be a plurality of metal lines in the same metal level, and a plurality of via contacts in the same contact level. The number of interconnect levels may depend on, for example, design requirements.

The metal lines and via contacts may be formed of metals, such as copper (Cu), copper alloy, aluminum (Al), or a combination thereof. Other suitable types of metal, alloys, or conductive materials for the interconnects may also be useful. The via contacts and metal lines of an interconnect level may be of the same type of conductive material or of different types of materials. For example, in upper levels of the interlevel dielectric 120, the metal lines and via contacts may be formed by dual damascene processes. This results in the metal lines and via contacts having the same material. Where the metal lines and via contacts are formed by single damascene processes, the materials of the metal lines and via contacts may be different.

According to various non-limiting embodiments, a thin film based passive component may be arranged in the interlevel dielectric 120. The thin film based passive component may be arranged between any metal level in the interlevel dielectric 120 (e.g., between M1 and M2, between M2 and M3, between M3 and M4, etc., up to the uppermost metal level). According to various non-limiting embodiments, a thin film 150 of the passive component may be arranged over a first ILD layer 122 in an interconnect level i 124 of the interlevel dielectric 120, where i may be from 1 to x. In a non-limiting example, x may be 10 in the case the interlevel dielectric 120 is designed with ten interconnect levels. It is understood that other numbers of interconnect levels may also be applicable. The interconnect level i may include a first interconnect 130 and a second interconnect 140 therein. The first interconnect 130 and the second interconnect 140 may each include a metal line in metal level i and a via contact in via level i−1 of the interconnect level i 124. As illustrated in FIGS. 1A-1E, the first ILD layer 122 may include the first interconnect 130 and the second interconnect 140. For example, the first ILD layer 122 may at least surround the metal lines of the first interconnect 130 and the second interconnect 140. The first ILD layer 122 may be formed of dielectric materials, such as low-k dielectric (e.g., SiCOH), TEOS, silicon oxide, silicon nitride, or combinations thereof. The first interconnect 130 and the second interconnect 140 may be single damascene structures or dual damascene structures.

According to various non-limiting embodiments, a nitride block insulator 160 may be arranged over the first ILD layer 122 and over the first interconnect 130 and the second interconnect 140. As illustrated in FIGS. 1A-1E, the nitride block insulator 160 may be arranged beneath the thin film 150. The nitride block insulator 160 may be a nitride-based insulator. In other words, the nitride block insulator 160 may include a nitride-containing layer. The nitride block insulator 160 may be formed of one or more layers of silicon nitride, silicon oxynitride, silicon oxide, or combinations thereof, in a non-limiting example. According to various non-limiting embodiments, the nitride block insulator 160 may have a thickness ranging from about 300A to about 1000A, in a non-limiting example.

Figure 1B:
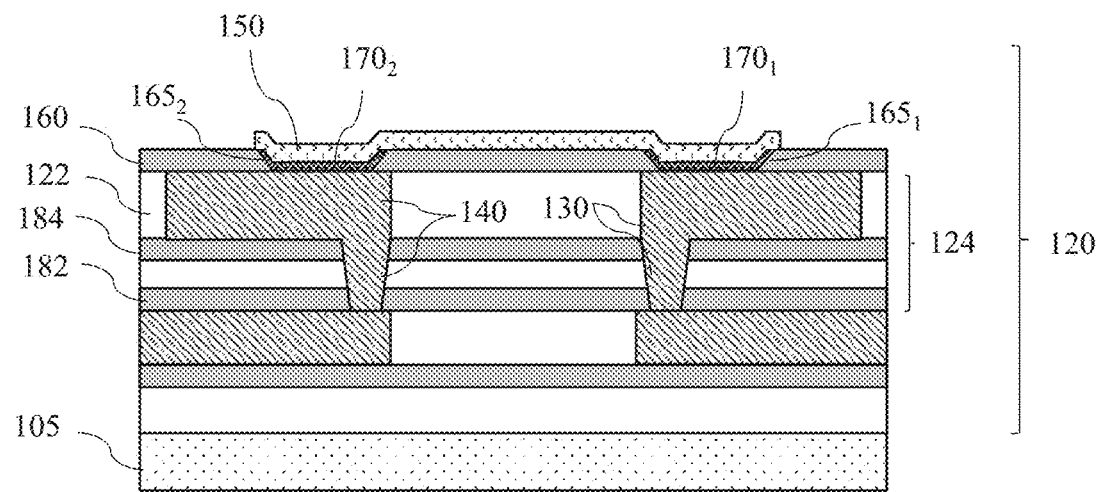

One or more openings 165 may be arranged in the nitride block insulator 160. An opening 165 may extend through the nitride block insulator 160 to expose a surface (e.g., top surface) of an interconnect in the first ILD layer 122. As illustrated in FIGS. 1A-1B, a first opening $165_1$ and a second opening $165_2$ may extend through the nitride block insulator 160 to expose a surface of the first interconnect 130 and the second interconnect 140 in the first ILD layer 122, respectively.

A contact plug 170 may be arranged in each opening 165 of the nitride block insulator 160. The contact plug 170 at least lines the opening 165 and prevents out-diffusion of conductive material from the interconnect in the ILD layer 122 over which it is disposed. For example, a first contact plug $170_1$ at least lines the first opening $165_1$ and prevents out-diffusion of conductive material from the first interconnect 130. Similarly, a second contact plug $170_2$ at least lines the second opening $165_2$ and prevents out-diffusion of conductive material from the second interconnect 140. The contact plug 170 may be formed of tungsten (W), tantalum (Ta), titanium (Ti), tantalum nitride (TaN), titanium nitride (TiN), or combinations thereof, in a non-limiting example. Other types of material for the contact plug may also be useful.

The thin film 150 may be arranged over the nitride block insulator 160 and over the contact plug 170. The thin film 150 may be formed of silicon chromium (SiCr), TiN, TaN, metallic mixtures, mixtures of ceramic-metal (cermet), or combinations thereof, in a non-limiting example. The material of the thin film 150 may include additional organic and/or inorganic elements, in a non-limiting embodiment. In other embodiments, the material of the thin film 150 may be provided without additional organic and/or inorganic elements. The yield properties (e.g., sheet resistivity, voltage coefficient of resistance (VCR), temperature coefficient of resistance (TCR)) of mixture elements can be tailored accordingly as desired. According to various non-limiting embodiments, the thin film 150 may have a thickness ranging from about 10A to about 1500A, in a non-limiting example.

According to various non-limiting embodiments, the contact plug 170 fills the opening 165 in the nitride block insulator 160. As illustrated in FIG. 1A, the contact plug 170 and the nitride block insulator 160 may have a substantially planar top surface. Accordingly, the thin film 150 may be arranged over the nitride block insulator 160 such that it is substantially planar.

According to various non-limiting embodiments, the contact plug 170 lines the opening 165 in the nitride block insulator 160. For example, the contact plug 170 lines sidewalls and a bottom of the opening 165 in the nitride block insulator 160, without completely filling the opening 165, as illustrated in FIG. 1B. Accordingly, the thin film 150 may be arranged over the nitride block insulator 160 such that the thin film 150 conforms to a topography of the nitride block insulator 160 and the contact plug 170 (i.e., thin film 150 conformal to the underlying nitride block insulator 160 and the contact plug 170).

According to various non-limiting embodiments, the thin film 150 covers the first contact plug $170_1$ and the second contact plug $170_2$ and serves as a thin film resistor. The thin film resistor electrically connects the first interconnect 130 and the second interconnect 140, as illustrated in FIGS. 1A and 1B. For example, the thin film resistor may have a bottom pick-up configuration. The first contact plug $170_1$ and the second contact plug $170_2$ form conductive paths between the thin film resistor 150 and interconnects 130 and 140. The conductive paths of the thin film resistor are formed without arranging via contacts between the thin film 150 and the interconnects 130 and 140.

According to various non-limiting embodiments, etch stop liners may be arranged in the interlevel dielectric 120. For example, a first nitride liner 182 and a second nitride liner 184 may be arranged in the interconnect level i. The first nitride liner 182 and the second nitride liner 184 may be arranged beneath the metal lines in the interconnect level i. For example, the first nitride liner 182 and the second nitride liner 184 may be arranged between metal lines in interconnect level i and metal lines in a preceding interconnect level 1−1. The etch stop liners may be used as an etch stop layer for the via etch process for forming the interconnects. The etch stop liners may be formed of silicon nitride, in a non-limiting embodiment. In other embodiments, such as in a dual damascene interconnect structure, the second nitride liner 184 may not be formed below the metal lines in the interconnect level i.

According to various non-limiting embodiments, the thin film embedded in the interlevel dielectric 120 may be a thin film capacitor, as will be described with respect to FIGS. 1C-1E.

According to various non-limiting embodiments, the thin film 150, the nitride block insulator 160, and the first interconnect 130 and the second interconnect 140 may form a metal-insulating-metal (MIM) capacitor. A contact plug 170 electrically connects the thin film 150 and the first interconnect 130. According to various non-limiting embodiments, the contact plug 170 fills the opening 165 in the nitride block insulator 160. The contact plug 170 and the nitride block insulator 160 may have a substantially planar top surface. The thin film 150 of the capacitor may be arranged over the nitride block insulator 160 such that it is substantially planar.

Figure 1C:
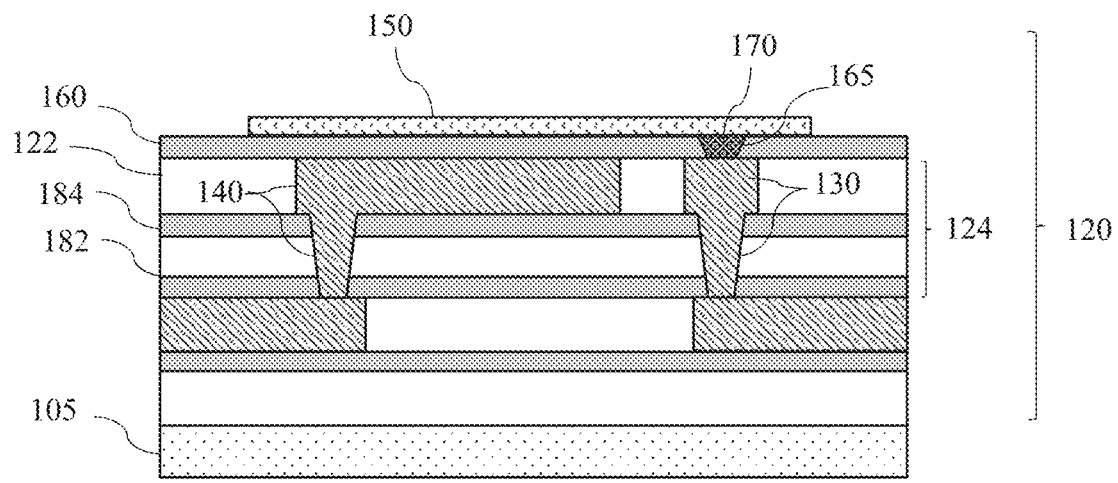
Figure 1D:
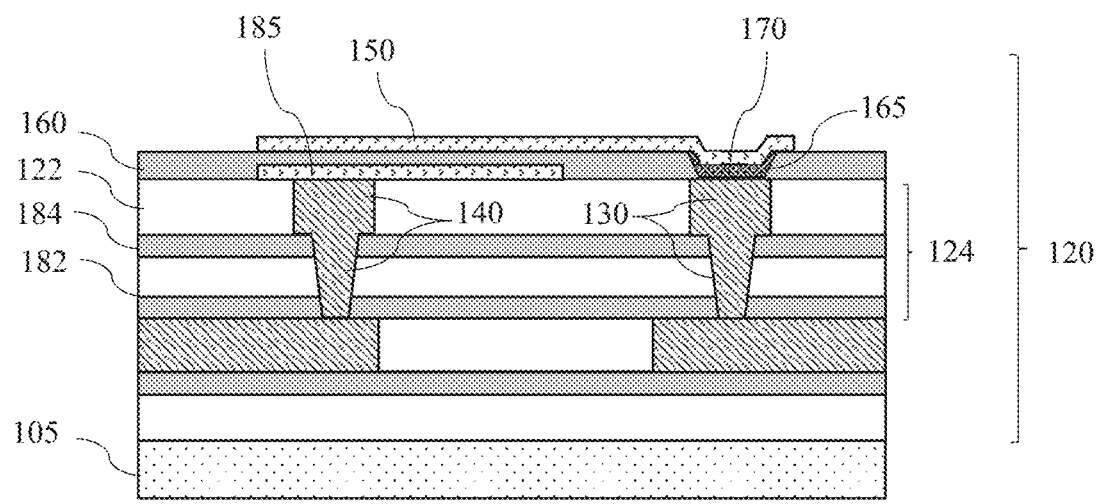

In other embodiments, the contact plug 170 lines the opening 165 in the nitride block insulator 160 without completely filling the opening 165, as illustrated in FIG. 1D. The thin film 150 of the capacitor may be arranged over the nitride block insulator 160 such that the thin film 150 conforms to a topography of the nitride block insulator 160 and the contact plug 170 (i.e., thin film 150 conformal to the underlying nitride block insulator 160 and the contact plug 170).

According to various non-limiting embodiments, a second thin film 185 of the capacitor may be arranged over the first interlevel dielectric layer 122 and beneath the nitride block insulator 160, as illustrated in FIG. 1D. The second thin film 185 contacts the second interconnect 140. The second thin film 185 may cover a surface of the second interconnect 140. The nitride block insulator 160 may be sandwiched between the thin film 150 and the second thin film 185 forming the MIM capacitor, in a non-limiting embodiment. For example, the thin film 150 and the second thin film 185 serves as top and bottom plates of an embedded capacitor in the interlevel dielectric 120 and forms conductive paths with the interconnects 130 and 140. As illustrated in FIG. 1D, the first nitride liner 182 and the second nitride liner 184 may be arranged between metal lines in interconnect level i and metal lines in a preceding interconnect level 1−1, in a non-limiting embodiment.

In another non-limiting embodiment, the back-end capacitor (e.g., including thin film 150 and second thin film 185 serving as top and bottom plates) may be formed over the first interconnect level, i.e., i=1. The metal lines M1 in the first interconnect 130 and the second interconnect 140 may be coupled to the substrate by via contacts CA. For example, the via contacts CA may be formed by tungsten. The via contacts CA may be coupled to the semiconductor substrate through salicided region over the substrate. In the case the interconnect level i=1 for the back-end capacitor, the second nitride liner 184 may be provided below M1, while the first nitride liner 182 is not needed.

According to various non-limiting embodiments, the first interconnect 130 and the second interconnect 140 may each include a plurality of interconnected metal fingers.

According to various non-limiting embodiments, the thin film 150 may be arranged to have a plurality of interconnected film fingers over the nitride block insulator 160.

According to various non-limiting embodiments, the second thin film 185 may be arranged in the same level as the thin film 150. As shown in FIG. 1E, the second thin film 185 of the passive component (e.g., capacitor) may be arranged over the nitride block insulator 160, where the thin film 150 and the second thin film 185 may be arranged to form an alternating polarity MIM capacitor with the first interconnect 130 and the second interconnect 140. The nitride block insulator 160 may be sandwiched between the thin films 150 and 185 and the first interconnect 130 and the second interconnect 140, as illustrated in FIG. 1E.

A first opening $165_1$ and a second opening $165_2$ may be arranged in the nitride block insulator 160 and may extend through the nitride block insulator 160 to expose a surface of the first interconnect 130 and the second interconnect 140 in the first ILD layer 122, respectively. A first contact plug $170_1$ at least lines the first opening $165_1$ and prevents out-diffusion of conductive material from the first interconnect 130. Similarly, a second contact plug $170_2$ at least lines the second opening $165_2$ and prevents out-diffusion of conductive material from the second interconnect 140. The thin film 150 contacts and may cover first contact plug $170_1$, while the second thin film 185 contacts and may cover the second contact plug $170_2$. The first contact plug $170_1$ electrically connects the thin film 150 and the first interconnect 130, while the second contact plug $170_2$ electrically connects the second thin film 185 and the second interconnect 140.

According to various non-limiting embodiments, the thin film 150 may include a plurality of interconnected first film fingers coupled to the first interconnect 130, while the second thin film 185 may include a plurality of interconnected second film fingers coupled to the second interconnect 140. Each first film finger may be arranged alternately with a second film finger for forming the alternating polarity MIM capacitor.

Figure 1E:
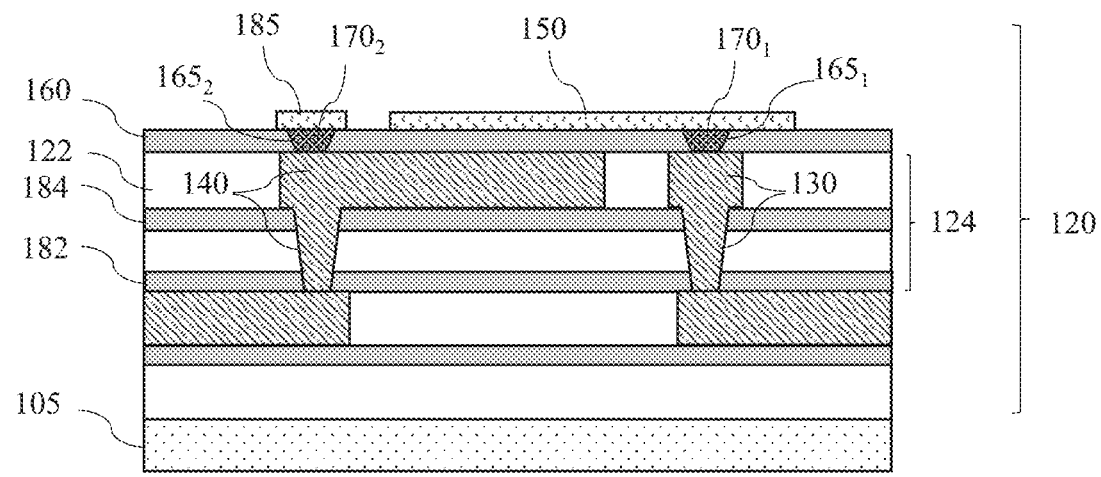

The one or more thin films of the passive component (e.g., thin film 150, second thin film 185) and the first interconnect 130 and the second interconnect 140 as described with respect to FIGS. 1C-1E may be a one metal-stack back-end capacitor. It is understood that other numbers of metal-stacks such as two metal-stack, three metal-stack, four metal-stack, five metal-stack, six metal-stack, or seven metal-stack may be arranged in other embodiments depending on connection between each level through via contacts.

Figure 2:
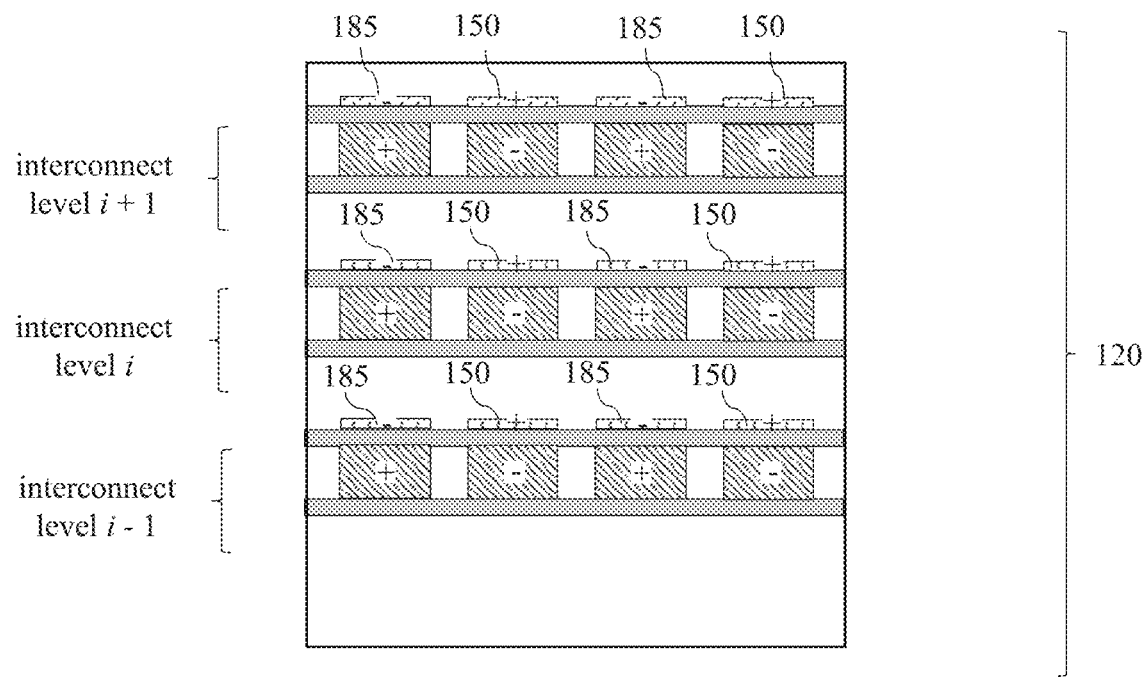
FIG. 2 shows another simplified cross-sectional view of an embodiment of the device.

FIG. 2 illustrates another simplified cross-sectional view of an embodiment of the device 100. According to various non-limiting embodiments, the device 100 may relate to a back-end capacitor and may include a multi metal-stack back-end capacitor embedded in the interlevel dielectric 120. A pair of thin film 150 and second thin film 185, each having interconnected film fingers arranged in alternating order, may be formed over various interconnect levels of the interlevel dielectric 120. For example, a three metal-stack back-end capacitor (e.g., three metal-stack alternating polarity MIM) may be arranged in the interlevel dielectric 120.

Figure 3A:
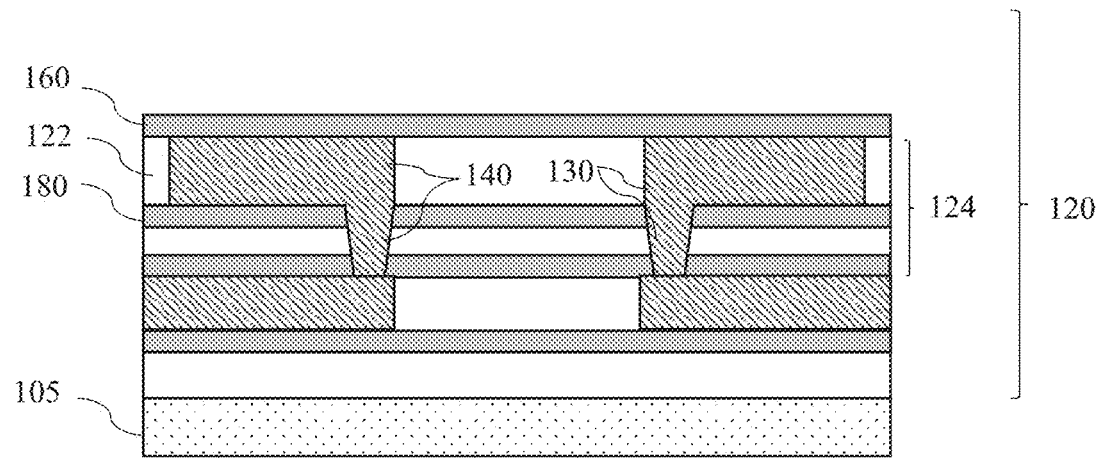
FIGS. 3A-3E show simplified cross-sectional views of a process for forming a device.

FIGS. 3A-3E show simplified cross-sectional views of a process 300 for forming a device. The device formed, for example, is similar or the same as that shown and described in FIG. 1A. Common elements may not be described or described in detail. As illustrated in FIG. 3A, a substrate 105 may be provided. The substrate may be a semiconductor substrate, such as a silicon substrate in a non-limiting embodiment. Other types of substrates may also be useful. For simplicity of discussion and in the interest of brevity, the processing of the substrate to form one or more circuit elements are not described. An interlevel dielectric 120 may be arranged over the substrate 105. The interlevel dielectric 120 may be formed by BEOL processing. Arranging the interlevel dielectric 120 may include forming a plurality of ILD layers and interconnects in the plurality of ILD layers depending on the design and number of interconnect levels in the interlevel dielectric 120. In a non-limiting example, the ILD layers may be formed by deposition such as plasma-enhanced chemical vapor deposition (PECVD). For example, the ILD layers may be patterned to form via openings and trenches by mask and etch techniques. For example, a via opening and a trench may be formed in an interconnect level for forming a via contact and a metal line. Metal may be deposited over the ILD layer, and a planarization process may be performed to form interconnects in the interconnect level. Other suitable material and techniques for forming the interlevel dielectric may also be useful. In the case the interconnect is formed of Cu (e.g., in a Cu BEOL process), a barrier layer, such as TaN in a non-limiting example, may be deposited prior to deposition of Cu to form the metal line and the via contact so as to prevent out-diffusion of Cu into the ILD layer.

According to various non-limiting embodiments, a first interlevel dielectric layer 122 may be formed in an interconnect level i 124. The interconnect level i 124 may be arranged over one or more lower interconnect levels in the case of forming a thin film resistor, in a non-limiting example. For example, the first interlevel dielectric layer 122 may include a first interconnect 130 and a second interconnect 140. A nitride block insulator 160 may be formed over the first interlevel dielectric layer 122. The nitride block insulator 160 may be formed after the planarization process to form the interconnects (e.g., first interconnect 130 and a second interconnect 140) in the first interlevel dielectric layer 122. The nitride block insulator 160 may be deposited by CVD or PVD, in a non-limiting example.

Figure 3B:
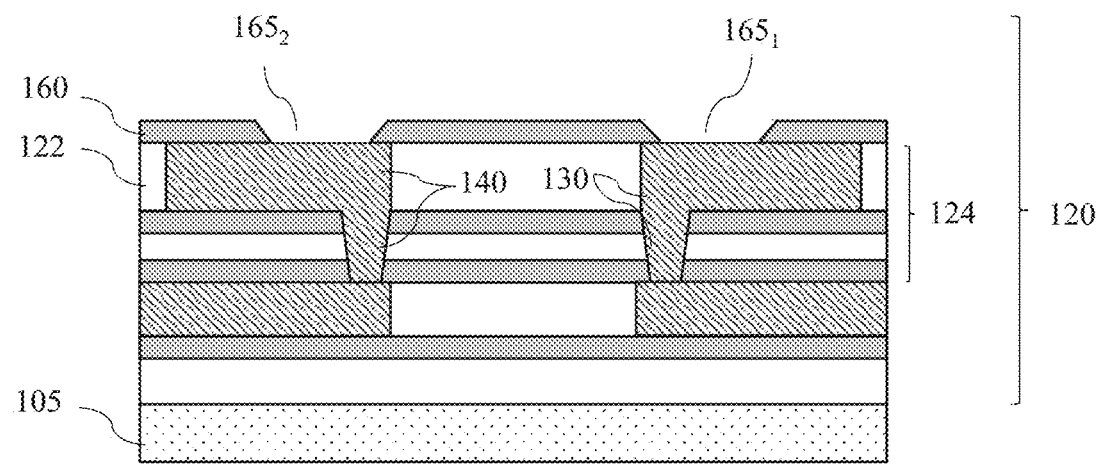

One or more openings 165 (e.g., first opening $165_1$ and second opening $165_2$) may be formed in the nitride block insulator 160, as illustrated in FIG. 3B. The first opening $165_1$ and the second opening $165_2$ may be formed by mask and etch techniques, in a non-limiting example. The first opening $165_1$ and the second opening $165_2$ extends through the nitride block insulator 160 to expose a top surface of the first interconnect 130 and the second interconnect 140 in the first interlevel dielectric layer 122. The mask may be removed after patterning the opening 165.

Figure 3C:
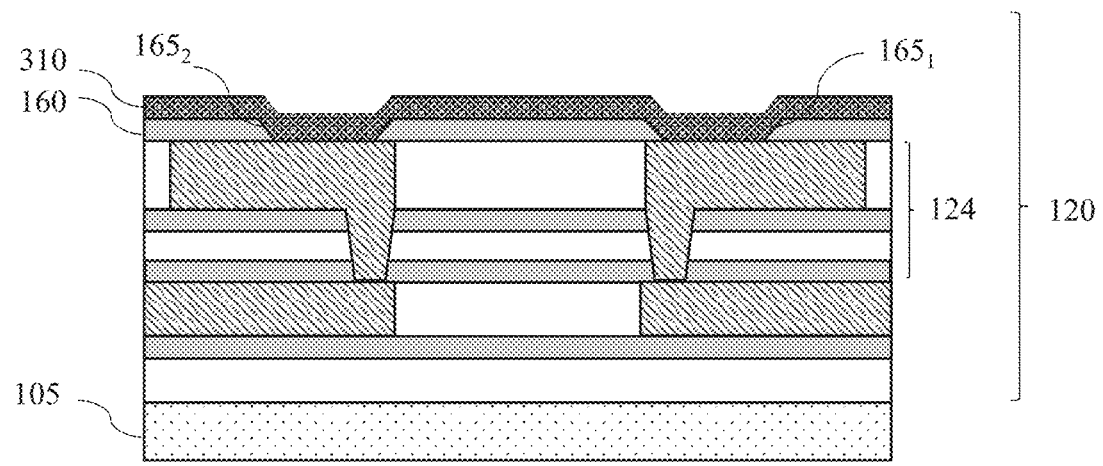
Figure 3D:
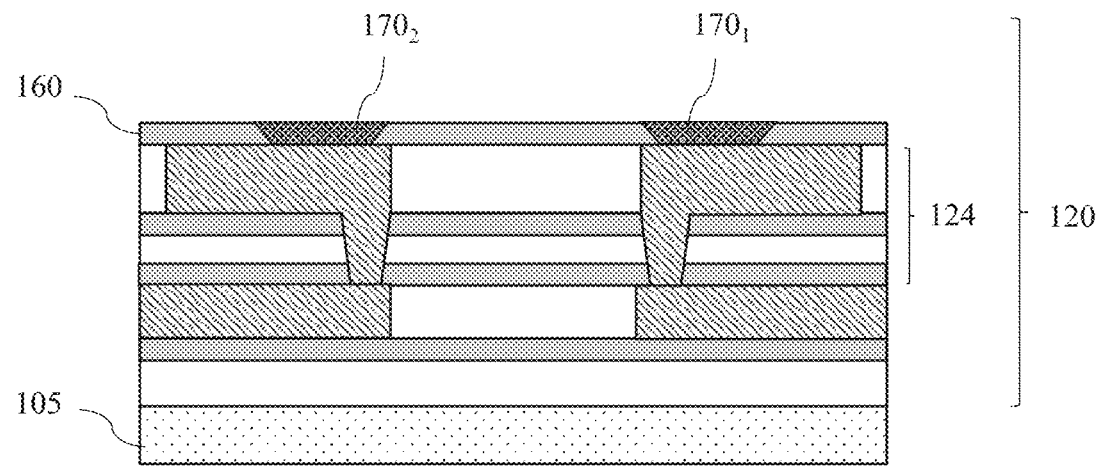

A contact plug may be formed in the first opening $165_1$ and second opening $165_2$ of the nitride block insulator, where the contact plug at least lines the first opening $165_1$ and second opening $165_2$ and prevents out-diffusion of conductive material from the underlying interconnects. Referring to FIG. 3C, a contact plug material 310 may be deposited over the nitride block insulator 160 to fill the opening 165 in the nitride block insulator 160 for forming the contact plug. The contact plug material 310 may be formed by PVD or CVD, in a non-limiting example. A planarization process, such as chemical mechanical polishing (CMP) in a non-limiting example, may be performed to provide a substantially planar top surface between the nitride block insulator 160 and the contact plug 170. For example, a first contact plug $170_1$ may be formed in the first opening $165_1$, and a second contact plug $170_2$ may be formed in the second opening $165_2$ of the nitride block insulator 160.

Figure 3E:
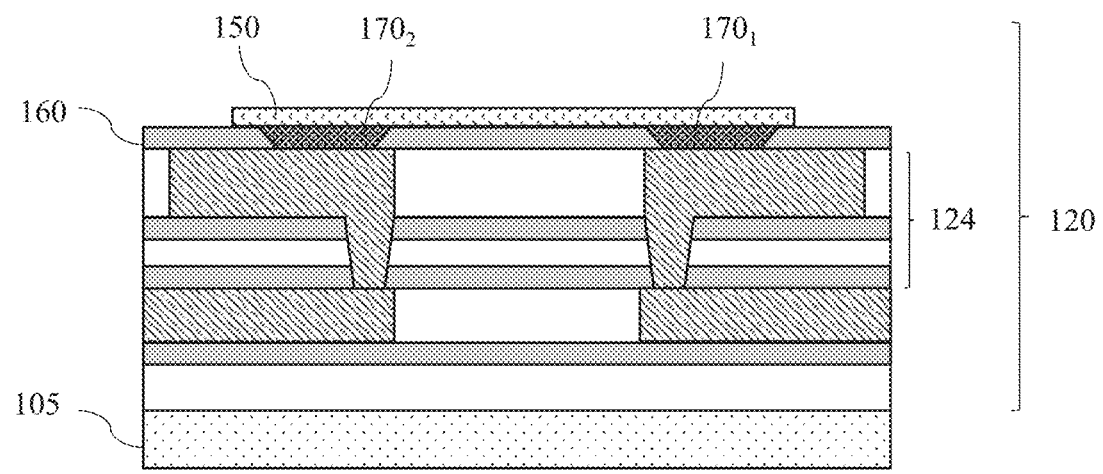

A thin film 150 of a passive component may be formed over the nitride block insulator 160 and over the first contact plug $170_1$ and the second contact plug $170_2$. For example, a layer of the thin film 150 may be deposited or sputtered over the nitride block insulator 160. The layer of the thin film 150 may be formed by blanket deposition. The layer of the thin film 150 may be patterned by mask and etch techniques to a desired active area of the thin film resistor. For example, the thin film 150 may be etch to a desired width and length. As illustrated in FIG. 3E, the thin film 150 covers the first contact plug $170_1$ and the second contact plug $170_2$ and serves as a thin film resistor. The thin film resistor electrically connects the first interconnect 130 and the second interconnect 140.

The process, for example, may continue to form additional dielectric layers (e.g., one or more TEOS layers and additional interconnect levels) and interconnects for the interlevel dielectric 120 until the uppermost interconnect in the interlevel dielectric 120.

FIGS. 4A-4D show simplified cross-sectional views of another exemplary process 400 for forming a device. The device formed, for example, is similar or the same as that shown and described in FIG. 1B. Common elements may not be described or described in detail.

Figure 4A:
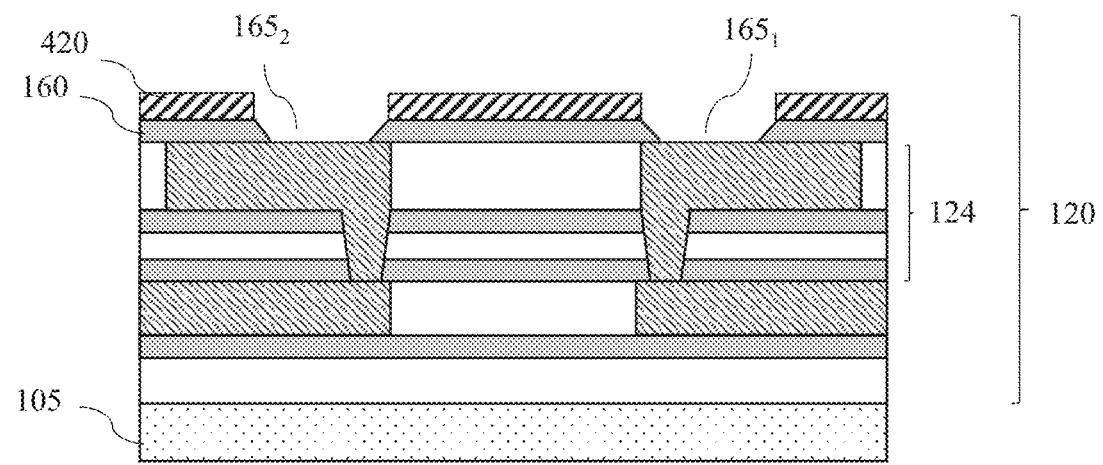
FIGS. 4A-4D show simplified cross-sectional views of another exemplary process for forming a device.
Figure 4B:
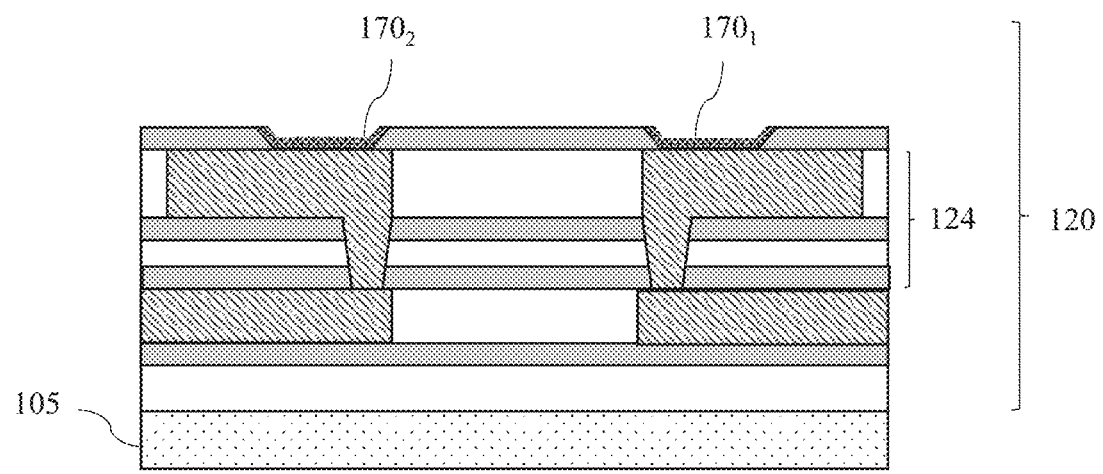

The process 400 may be similar to process 300 as described in FIGS. 3A-3B. As illustrated in FIG. 4A, the first opening $165_1$ and the second opening $165_2$ may be formed in the nitride block insulator 160 using a patterned hard mask 420. The patterned hard mask 420 may be removed prior to forming the contact plug. The contact plug may be formed in the first opening $165_1$ and the second opening $165_2$ of the nitride block insulator 160 by depositing or sputtering contact plug material to at least line the first opening $165_1$ and the second opening $165_2$ in the nitride block insulator 160. For example, the contact plug material may be deposited to a thickness ranging from about 300A to about 1000A. Excess contact plug material external to the first opening $165_1$ and the second opening $165_2$ may be removed by a planarization process such as CMP. FIG. 4B illustrates the first contact plug $170_1$ and the second contact plug $170_2$ lining the first opening $165_1$ and the second opening $165_2$, respectively.

Figure 4C:
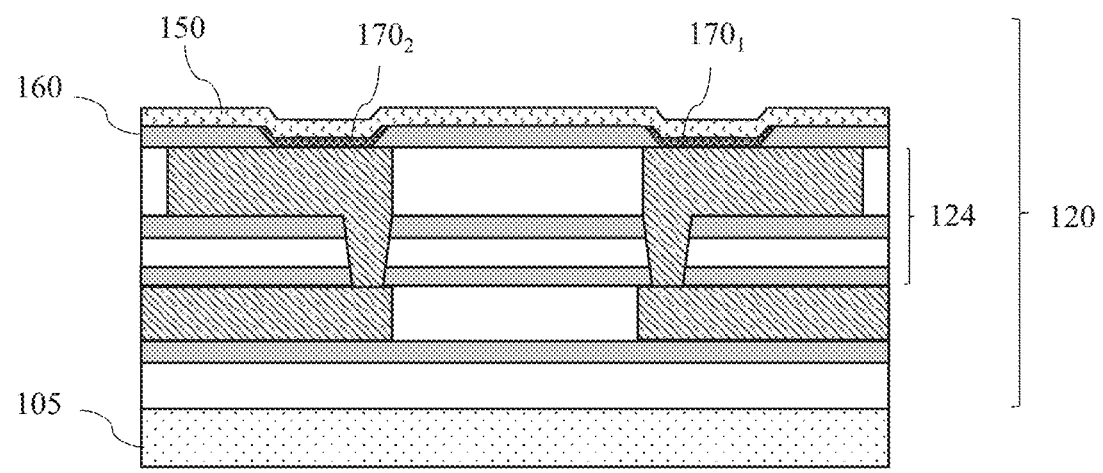
Figure 4D:
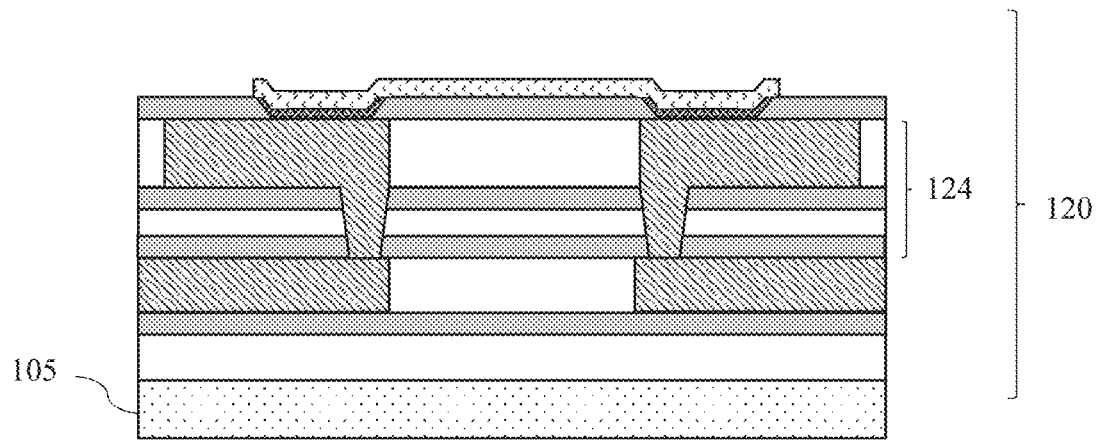

The thin film 150 of the passive component may be formed over the nitride block insulator 160 and over the first contact plug $170_1$ and the second contact plug $170_2$. For example, a layer of the thin film 150 may be deposited or sputtered over the nitride block insulator 160, as illustrated in FIG. 4C. The thin film 150 may be patterned by mask and etch techniques. The thin film 150 may be etched to a desired width and length, forming a desired active area of the thin film resistor. The thin film 150 may be etched such that it completely covers a top surface of the first contact plug $170_1$ and the second contact plug $170_2$. As illustrated in FIG. 4D, the thin film 150 may be conformal to a topography of the nitride block insulator 160 and the first contact plug $170_1$ and the second contact plug $170_2$.

Figure 5A:
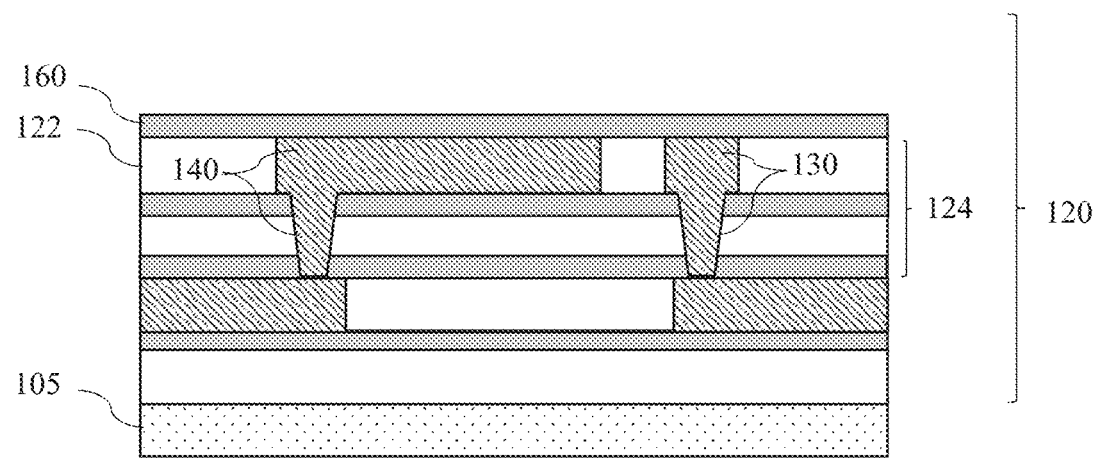
FIGS. 5A-5C show simplified cross-sectional views of yet another exemplary process for forming a device.
Figure 5B:
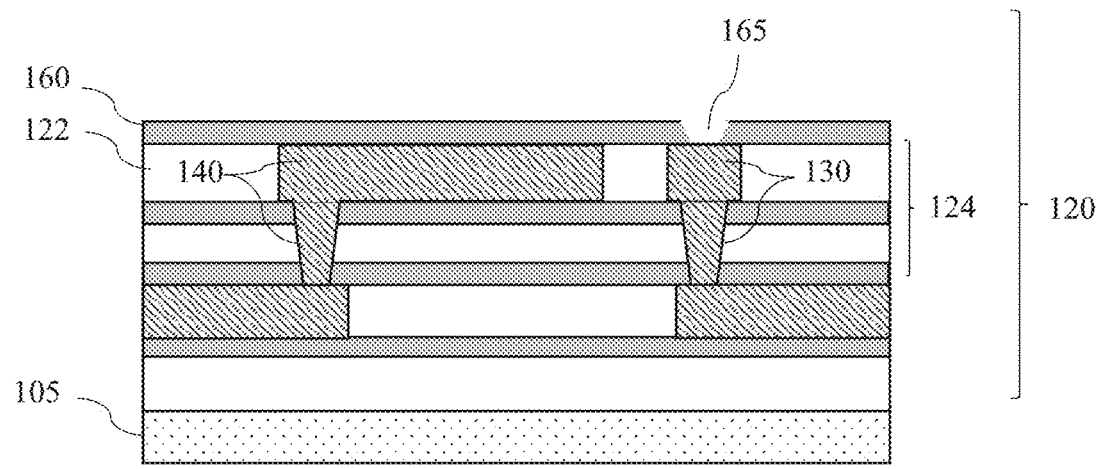
Figure 5C:
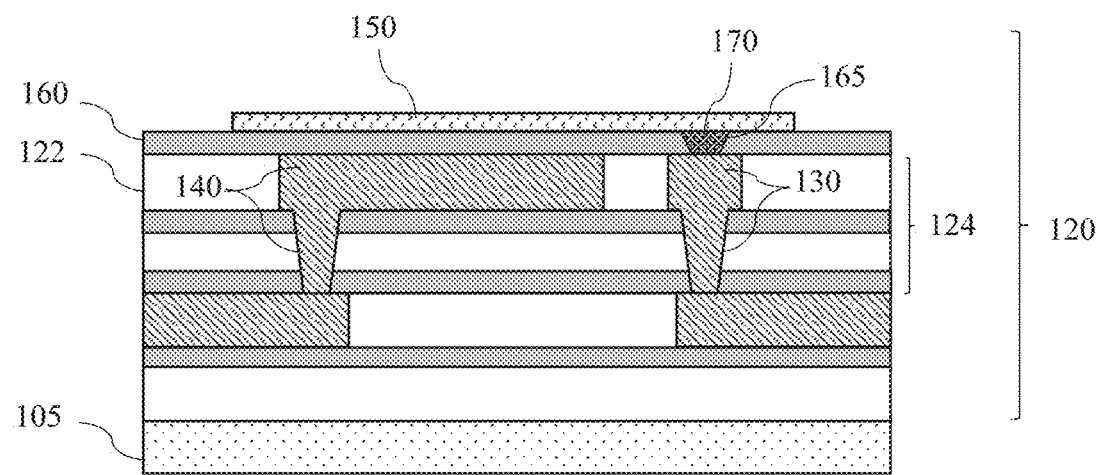

FIGS. 5A-5C show simplified cross-sectional views of another exemplary process 500 for forming a device. The device formed, for example, is similar or the same as that shown and described in FIGS. 1C-1E. For example, the process 500 may be used to form a back-end thin film capacitor. Common elements may not be described or described in detail.

The process 500 may be similar to that described with respect to FIGS. 3A-3E and FIGS. 4A-4D. As shown in FIG. 5A, the nitride block insulator 160 may be formed over the first interlevel dielectric layer 122. In some embodiments, a second thin film of the passive component may be formed prior to forming the nitride block insulator 160. For example, the second thin film of the passive component may contact and cover a top surface of the second interconnect 140 (not shown in FIG. 5A).

Referring to FIG. 5B, an opening 165 may be formed in the nitride block insulator 160. A contact plug 170 may be formed in the opening of the nitride block insulator 160. The contact plug 170 at least lines the opening and prevents out-diffusion of conductive material from the first interconnect 130, as illustrated in FIG. 5C. A layer of thin film for the passive component may be deposited over the nitride block insulator 160 by sputtering, in a non-limiting example, and may be patterned by mask and etch techniques. The layer of the thin film may be patterned to define an active area of a thin film 150, as illustrated in FIG. 5C. For example, the thin film 150 may be arranged over the nitride block insulator 160 and over the contact plug 170. The thin film 150 contacts the first interconnect 130. In other embodiments, the layer of the thin film may be patterned to define an active area of the thin film 150 and a second thin film 185, as illustrated in FIG. 1E.

The process, for example, may continue to form additional dielectric layers (e.g., additional interconnect levels) and interconnects for the interlevel dielectric 120 until the uppermost interconnect.

Figure 6A:
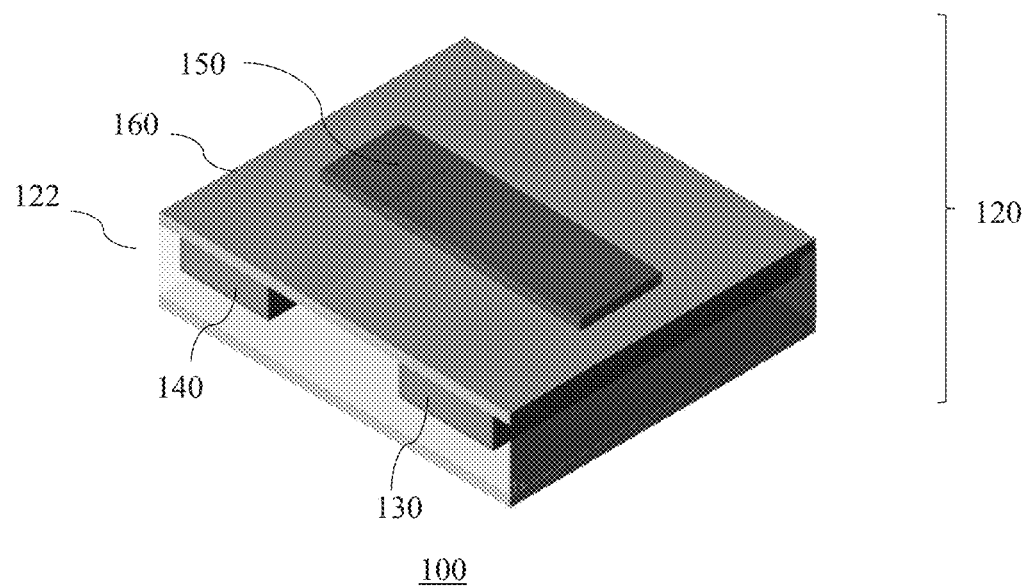
FIGS. 6A-6D show simplified perspective views of embodiments of the device.

FIG. 6A shows a simplified perspective view of an embodiment of the device 100. For example, the thin film 150 may be patterned to define an active area of a thin film resistor in the interlevel dielectric 120. The thin film 150 may cover the first contact plug and the second contact plug (not visible in FIG. 6A) disposed in the nitride block insulator 160. The thin film resistor electrically connects the first interconnect 130 and the second interconnect 140.

Figure 6B:
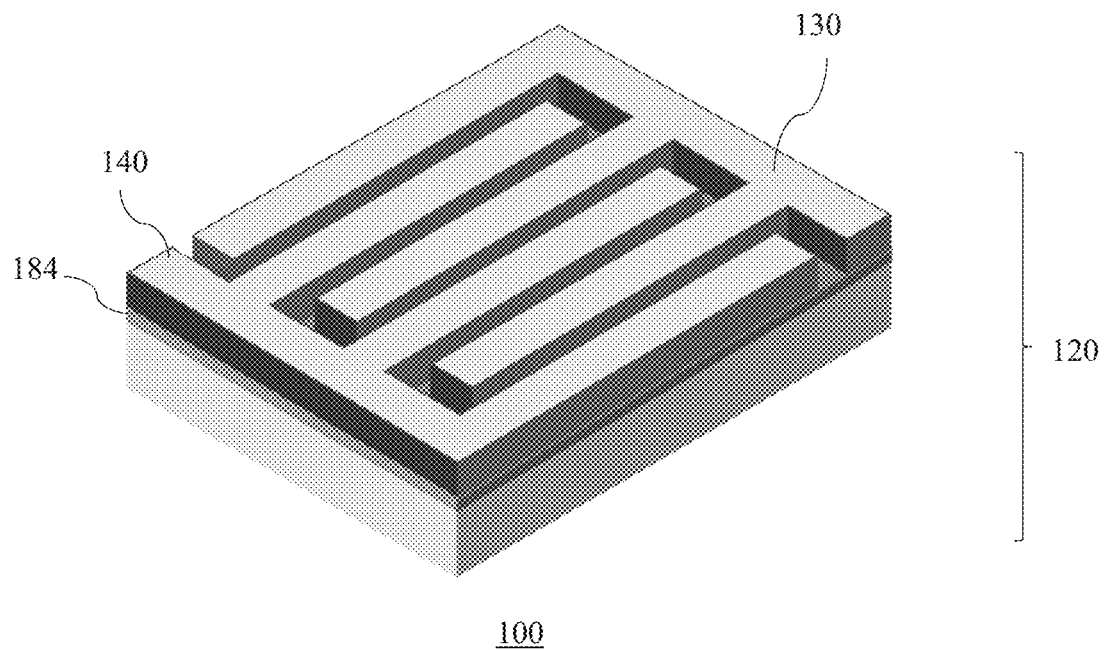
Figure 6C:
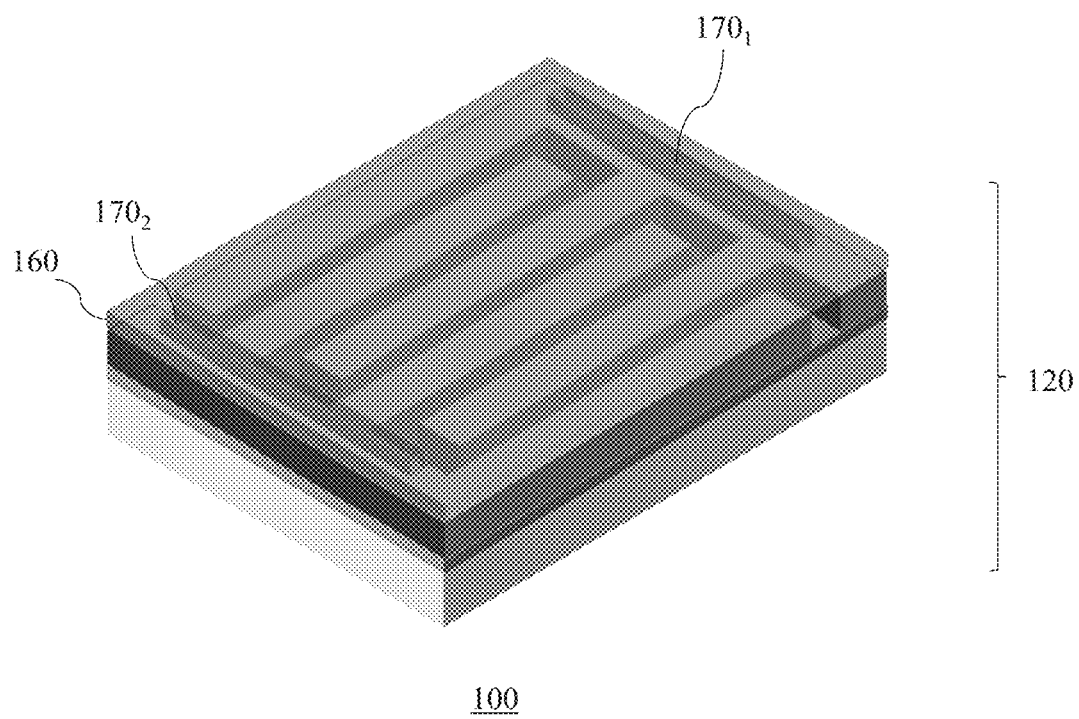
Figure 6D:
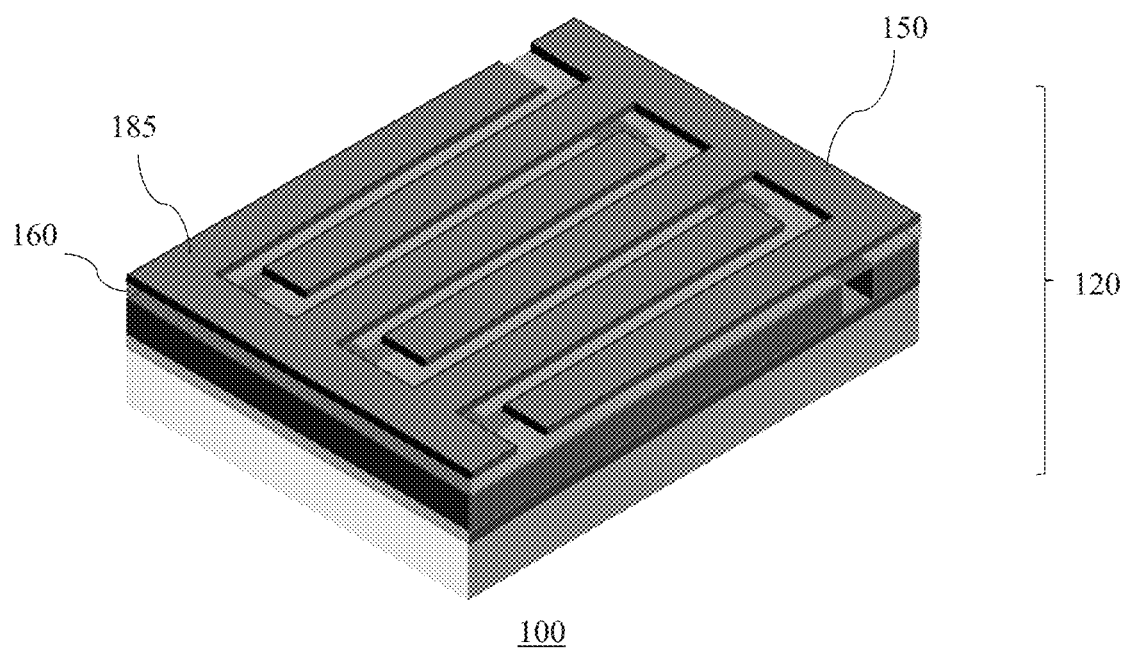

FIGS. 6B-6D show simplified perspective views of an embodiment of the device 100 having a thin film capacitor embedded in the interlevel dielectric 120. As illustrated in FIG. 6B, the first interconnect 130 and the second interconnect 140 may be arranged in the first interlevel dielectric layer 122. The first interconnect 130 and the second interconnect 140 in the first interlevel dielectric layer 122 may be metal lines in the metal level (e.g., M1, M2, M3, etc.). As illustrated in FIG. 6C, the nitride block insulator 160 may be arranged over the first interlevel dielectric layer 122 and the first interconnect 130 and the second interconnect 140. The first contact plug $170_1$ and the second contact plug $170_2$ may be arranged in the nitride block insulator 160 to contact the first interconnect 130 and the second interconnect 140, respectively. FIG. 6D illustrates thin film 150 and second thin film 185 arranged over the nitride block insulator 160. As described, a layer of thin film may be sputtered over the nitride block insulator 160. The layer of thin film may be patterned to define an active area of the thin film 150 and a second thin film 185. The thin film 150 contacts and may cover first contact plug $170_1$, while the second thin film 185 contacts and may cover the second contact plug $170_2$. The first contact plug $170_1$ electrically connects the thin film 150 and the first interconnect 130, while the second contact plug $170_2$ electrically connects the second thin film 185 and the second interconnect 140.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate;
   an interlevel dielectric arranged over the substrate, the interlevel dielectric comprising: a first interlevel dielectric layer in an interconnect level i, the first interlevel dielectric layer having a first interconnect and a second interconnect therein;
   a nitride block insulator arranged over the first interlevel dielectric layer and over the first interconnect and the second interconnect;
   an opening arranged in the nitride block insulator, the opening extending through the nitride block insulator to expose a surface of the first interconnect in the first interlevel dielectric layer;
   a contact plug arranged in the opening of the nitride block insulator, wherein the contact plug at least lines the opening and partially fills the opening, wherein the contact plug lines a bottom and sidewalls of the opening in the nitride block insulator without completely filling the opening, thereby preventing out-diffusion of conductive material from the first interconnect; and
   a first film of a passive component arranged over the nitride block insulator and over the contact plug, wherein the first film conforms to a topography of the nitride block insulator and the contact plug by directly lining a bottom and sidewalls of the contact plug in the opening and directly contacting the nitride block insulator beyond the opening.

2. The device of claim 1, wherein the first film extends continuously from over the first interconnect to over the second interconnect.

3. The device of claim 2, further comprising:
   a second opening arranged in the nitride block insulator, the second opening extending through the nitride block insulator to expose a surface of the second interconnect in the first interlevel dielectric layer;

a second contact plug arranged in the second opening of the nitride block insulator, wherein the second contact plug at least lines the second opening and partially fills the opening, thereby preventing out-diffusion of conductive material from the second interconnect; and wherein the first film further covers the second contact plug and serves as a film resistor, the film resistor electrically connects the first interconnect and the second interconnect.

4. The device of claim 2, wherein the first film, nitride block insulator, and the first interconnect and the second interconnect form a metal-insulating-metal (MIM) capacitor.

5. The device of claim 4, further comprising a second film of the passive component arranged over the first interlevel dielectric layer and beneath the nitride block insulator, wherein the second film covers a surface of the second interconnect.

6. The device of claim 2, wherein a material of the contact plug comprises tungsten, tantalum, titanium, tantalum nitride, titanium nitride, or combinations thereof.

7. The device of claim 6, wherein the first interconnect and the second interconnect each comprises a copper metal line.

8. The device of claim 7, further comprising:

a first and second nitride liners in the interconnect level i, the first and second interconnects disposed over the second nitride liner and extending through the second nitride liner and the first nitride liner disposed below the second nitride liner, wherein the first and second nitride liners are arranged between the copper metal lines in the interconnect level i and metal lines in a preceding interconnect level i−1.

9. The device of claim 5, wherein each of the first and second films comprises interconnected first film fingers arranged in alternating order.

10. The device of claim 1, wherein the opening exposes a partial surface of the first interconnect in the first interlevel dielectric layer and the first interconnect extends beyond a bottom of the opening.

11. The device of claim 1, wherein the nitride block insulator has a thickness ranging from about 300A to about 1000A, and the first film has a thickness ranging from about 10A to about 1500A, and the contact plug has a thickness ranging from about 300A to about 1000A.

12. A method of forming a device, comprising:

providing a substrate;

arranging an interlevel dielectric over the substrate, wherein arranging the interlevel dielectric comprises:

forming a nitride block insulator over a first interlevel dielectric layer in an interconnect level i of the interlevel dielectric, wherein the first interlevel dielectric layer comprises a first interconnect and a second interconnect therein;

forming an opening in the nitride block insulator, the opening extending through the nitride block insulator to expose a surface of the first interconnect in the first interlevel dielectric layer;

forming a contact plug in the opening of the nitride block insulator, wherein the contact plug at least lines the opening and partially fills the opening, wherein the contact plug lines a bottom and sidewalls of the opening in the nitride block insulator without completely filling the opening, thereby preventing out-diffusion of conductive material from the first interconnect; and forming a first film of a passive component over the nitride block insulator and over the contact plug, wherein the first film conforms to a topography of the nitride block insulator and the contact plug by directly lining a bottom and sidewalls of the contact plug in the opening and directly contacting the nitride block insulator beyond the opening.

13. The method of claim 12, wherein forming the contact plug comprises:

depositing contact plug material over the nitride block insulator to fill the opening in the nitride block insulator so as to form a recess from a surface of the nitride block insulator.

14. The method of claim 12, wherein forming the contact plug comprises depositing contact plug material to at least line the opening in the nitride block insulator, and wherein the first film is conformal to a topography of the nitride block insulator and the contact plug.

15. The method of claim 12, further comprising:

forming a second opening in the nitride block insulator, the second opening extending through the nitride block insulator to expose a surface of the second interconnect in the first interlevel dielectric layer;

forming a second contact plug in the second opening of the nitride block insulator, wherein the second contact plug at least lines the second opening and partially fills the opening, thereby preventing out-diffusion of conductive material from the second interconnect; and wherein the first film further covers the second contact plug and serves as a film resistor, the film resistor electrically connects the first interconnect and the second interconnect.

16. The method of claim 12, further comprising forming a second film of the passive component over the first interlevel dielectric layer and beneath the nitride block insulator, wherein the second film covers a surface of the second interconnect.

17. The method of claim 12, wherein the first interconnect and the second interconnect each comprises a copper metal line, the method further comprising:

forming a first and second nitride liners in the interconnect level i, the first and second interconnects disposed over the second nitride liner and extending through the second nitride liner and the first nitride liner disposed below the second nitride liner, wherein the first and second nitride liners are arranged between the copper metal lines in the interconnect level i and metal lines in a preceding interconnect level i−1.

18. The device of claim 1, wherein the nitride block insulator directly contacts the first interlevel dielectric layer, the first interconnect and the second interconnect.

19. The device of claim 1, wherein the first film fills the opening.

* * * * *